(12) United States Patent
Schrems

(10) Patent No.: US 6,580,110 B2
(45) Date of Patent: Jun. 17, 2003

(54) TRENCH CAPACITOR AND METHOD FOR FABRICATING A TRENCH CAPACITOR

(75) Inventor: Martin Schrems, Langebrück (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/833,352

(22) Filed: Apr. 12, 2001

(65) Prior Publication Data

US 2001/0044180 A1 Nov. 22, 2001

(30) Foreign Application Priority Data

Apr. 12, 2000 (DE) .......................................... 100 19 090

(51) Int. Cl.⁷ .......................... A01L 29/76; A01L 29/94; A01L 31/062; A01L 31/113; A01L 31/119
(52) U.S. Cl. ........................ 257/301; 257/296; 257/303; 257/304; 257/305
(58) Field of Search ................................ 257/301–305, 257/296

(56) References Cited

U.S. PATENT DOCUMENTS

| 6,177,696 | B1 | * | 1/2001 | Bronner et al. | ............. | 257/301 |
| 6,200,873 | B1 | * | 3/2001 | Schrems et al. | ............ | 438/386 |
| 6,194,755 | B1 | * | 2/2002 | Gambino et al. | ........... | 257/301 |
| 6,344,390 | B1 | * | 2/2002 | Bostelmann et al. | ....... | 438/249 |

FOREIGN PATENT DOCUMENTS

| DE | 198 42 665 A1 | 4/2000 |
| EP | 0 949 680 A2 | 10/1999 |

* cited by examiner

*Primary Examiner*—Eddie Lee
*Assistant Examiner*—Jesse A. Fenty
(74) *Attorney, Agent, or Firm*—Laurence A. Greenberg; Werner H. Stemer; Ralph E. Locher

(57) ABSTRACT

A trench capacitor has an insulation collar that is formed non-conformally in the upper region of a trench in such a way that a layer thickness in an upper section of the insulation collar is greater than a layer thickness in a lower section of the insulation collar. This results in a trench capacitor having improved leakage current properties. A simplified and cost-effective method of fabricating a trench capacitor is also provided.

6 Claims, 14 Drawing Sheets

TRENCH CAPACITOR AND METHOD FOR FABRICATING A TRENCH CAPACITOR

BACKGROUND OF THE INVENTION

Field of the Invention

The invention relates to a trench capacitor and a method of fabricating a trench capacitor. The invention relates in particular to a trench capacitor having improved leakage current properties and an associated fabrication method with simplified process steps for forming an insulation collar.

FIG. 1 is a simplified sectional view of a DRAM semiconductor memory cell with a trench capacitor in accordance with the prior art, as is disclosed for example in the Published European Patent Application No. EP 0 949 680 A2. In accordance with FIG. 1, a conventional DRAM (Dynamic Random Access Memory) semiconductor memory cell has a trench capacitor 160 formed in a substrate 101. The trench capacitor 160 essentially includes a trench 108 filled with a conductive filling material 161 as a second capacitor plate. In the vicinity of a lower region of the trench 108, a buried plate 165 is formed as a first capacitor plate in the substrate 101. The buried plate may be formed for example by diffusion from an ASG (arsenosilicate glass) layer. Situated between the buried plate 165 serving as first capacitor plate and the filling material 161 serving as second capacitor plate there is a dielectric layer 164 for lining the lower region of the trench 108 and for forming a capacitor dielectric.

Furthermore, the DRAM semiconductor memory cell has a field-effect transistor 110, which has a gate 112 and also source and drain diffusion regions 113 and 114. The diffusion regions 113 and 114 are isolated from one another by a channel 117, the diffusion region 114 being connected to the trench capacitor 160 via a contact region 125.

In order to avoid undesirable leakage currents, an insulation collar or simply collar 168 is situated on an upper region of the trench capacitor 160 or of the trench 108. A buried well or layer 170 is situated below the surface of the substrate 101 and essentially serves as a connection between the buried plates 165 of the respective adjacent DRAM semiconductor memory cells in the memory cell array.

In order to control the respective DRAM semiconductor memory cells or the memory array, each cell has a bit line and also a word line. Usually, the gates 112 form a word line, while the diffusion region 113 is connected to a bit line 185 via a contact 183. In this case, the bit line 185 is isolated from the diffusion region by an insulating layer 189.

In accordance with FIG. 1, respectively adjacent DRAM semiconductor memory cells are isolated from one another by a shallow trench isolation (STI). A word line 120 lies not only above the actual transistor 110 but also above the trench 108. A "folded bit line architecture" is thereby obtained. However, the invention described below is not restricted to an architecture of this type.

FIGS. 2A to 2C show essential method steps for forming the insulation collar 168 in accordance with the prior art. Identical reference symbols designate identical or similar elements or layers which are only described once in detail.

In accordance with FIG. 2A, firstly the trench 108 is formed in the semiconductor substrate 101 with the aid of a "pad stack" 107. The pad stack 107 includes, for example, a pad oxide layer 104 and a pad stop layer 105, on which a hard mask layer (not illustrated) can be superposed. An oxide layer ($SiO_2$) or boundary layer 151 serving as an etching stop layer or barrier layer preferably has a thickness of 5 to 50 nm and can be formed by deposition or ca be formed thermally. A detailed description of the method for forming the pad stack 107 or the trench 108 is dispensed with at this point since it essentially corresponds to a conventional method.

Furthermore, in accordance with FIG. 2A, a sacrificial filling material 152, composed of polysilicon for example, is formed in a lower region of the trench 108. A coplanar insulation collar layer 167 is subsequently formed on the surface of the wafer and in the trench 108. This conformal insulation collar layer 167 or collar layer is formed for example through the use of a chemical deposition method (CVD, chemical vapor deposition), an oxide having a constant thickness of approximately 2 to 10 nm preferably being deposited. A densification is subsequently carried out in order to improve the properties of the insulation collar layer 167, the densification taking place for example at a temperature of approximately 1000° C. in an $N_2$ or Ar environment.

In accordance with FIG. 2B, in a subsequent method step the insulation collar layer 167 or the collar is patterned, a reactive ion etching (RIE) preferably being carried out, using $CF_4$, $CHF_3$ or $C_4F_8$ for example. In accordance with FIG. 2B, after this patterning step no insulation collar layer 167 remains on the pad stack 107, as a result of which the insulation collar 168 is essentially formed. During this method step, the sacrificial filling material 152 is simultaneously uncovered in the trench 108, in order thus to allow to remove the sacrificial filling material 152.

In accordance with FIG. 2C, in a subsequent method step, the sacrificial filling material 152 and the boundary layer 151 are completely removed in the lower region of the trench 108 (in particular if a thermal oxide ($SiO_2$) and/or a deposited oxide is used as the boundary layer 151, then it can be preserved as a barrier layer in the upper region of the trench 108), which may also result in the insulation collar 168 being etched back in its upper region. In the worst-case situation during such a method step, the insulation collar 168 is etched back on its top side to such an extent that the semiconductor substrate 101 is uncovered and the substrate 101 is etched in an upper region of the trench 108. The probability of the substrate 101 being undesirably uncovered in such a way is also increased if, by way of example, the trench is extended in the lower region of the trench 108. The functioning of the DRAM semiconductor memory cell is thereby significantly impaired or completely prevented. Furthermore, with the use of vapor phase doping for forming the buried plate 165, at the uncovered silicon edge, a highly doped region can likewise be formed in an undesirable manner, such that the functioning of the semiconductor memory cell once again suffers as a result.

Since, in the method described above, the insulation collar layer 167 is completely removed from the pad stack 107, a part of the pad stack 107 is eroded in the course of a subsequent overetching process for ensuring a sufficient opening to the sacrificial filling material 152. Such erosion of the pad nitride or the pad stack 107 in the cell array and in planar support regions (not illustrated) takes place nonuniformly, which is why planarisation in particular of the shallow trench isolation (STI) in subsequent process steps is made more difficult. Furthermore, a predetermined minimum thickness of the pad stack or of the pad nitride layer as etching stop layer is necessary for the shallow trench isolation or the STI oxide 180, so that an initial thickness of the pad stack or pad nitride increased by the erosion thickness is usually required. This increased pad stack thickness in turn requires a longer mask opening process for the trench 108 (deep trench mask open process), which consumes more resist, as a result of which a thicker resist layer becomes necessary. However, a thicker resist layer in turn adversely affects the process window of trench lithography, which can lead to a reduced yield.

Furthermore, the pad stack 107 can likewise be eroded during subsequent etching processes, which can once again lead to losses of yield. Moreover, in the event of facetting of the stop layer or pad nitride layer 105 (greatly tapered pad nitride layer 105 at the edge of the trench), the substrate may be uncovered above the upper insulation collar edge. Such a pad nitride facetting usually arises during a trench etching process, the selectivity of the trench etching process with respect to the hard mask decreasing toward the edge of a wafer. Therefore, the hard mask, which is intended to protect the pad nitride 105 against an etching attack, can be completely eroded during the trench etching process for trenches at the wafer edge, as a result of which "pad nitride facetting" arises. In the extreme case, the pad nitride layer 105 can be completely eroded (not illustrated) in the region around the trenches at the wafer edge, with the result that the silicon upper edge is completely uncovered. This can lead to the destruction of the trench structures in proximity to the surface. Silicon particles are thereby produced which are in turn distributed over the entire wafer during a subsequent wet cleaning processes and which lead to enormous losses of yield.

SUMMARY OF THE INVENTION

It is accordingly an object of the invention to provide a trench capacitor and a method of fabricating a trench capacitor which overcome the above-mentioned disadvantages of the heretofore-known trench capacitors and fabrication methods of this general type such that a trench capacitor having an improved leakage current behavior and an associated fabrication method having an improved yield and a simplified and cost-effective insulation collar process is achieved.

With the foregoing and other objects in view there is provided, in accordance with the invention, a trench capacitor, including:

a substrate having a trench formed therein, the trench having an upper region and a lower region;

an insulation collar formed non-conformally in the upper region of the trench, the insulation collar having an upper section and a lower section, the insulation collar having a first layer thickness in the upper section and having a second layer thickness in the lower section, the first layer thickness being greater than the second layer thickness;

a buried plate formed adjacent to the lower region of the trench as a first capacitor plate;

a dielectric layer lining the lower region of the trench and the insulation collar as a capacitor dielectric; and a conductive filling material filled into the trench as a second capacitor plate.

In particular by virtue of using a non-conformal insulation collar which has a larger layer thickness in an upper section of the trench than in a lower section of the trench, an improved leakage current behavior and an increased yield are obtained in conjunction with simplified process control.

Preferably, the insulation collar is formed such that it is essentially triangular, and can include one or a plurality of layers. In the case of an insulation collar including a plurality of layers, one layer may serve as a (sacrificial) protective layer with respect to subsequent etching processes.

In accordance with another feature of the invention, the insulation collar includes a plurality of layers.

In accordance with yet another feature of the invention, wherein at least one of the plurality of layers is a non-conformally formed layer.

In accordance with a further feature of the invention, the trench is a bottle-shaped trench, and the conductive filling material has a widened region with a cavity formed therein.

In accordance with another feature of the invention, the insulation collar is composed of an oxide, a nitride and/or an oxinitride.

With the objects of the invention in view there is also provided, a method for fabricating a trench capacitor, which includes the steps of:

forming a trench in a substrate;

providing a sacrificial filling material in a lower region of the trench;

forming a non-conformal layer in the trench having the sacrificial filling material in the lower region;

removing at least a part of the non-conformal layer for uncovering the sacrificial filling material;

removing the sacrificial filling material from the lower region of the trench;

forming a buried plate in the substrate adjacent to the lower region of the trench as a first capacitor plate;

forming a dielectric layer, which lines the lower region of the trench and lines an inner side of an insulation collar, as a capacitor dielectric; and filling the trench with a conductive filling material as a second capacitor plate.

In other words, the insulation collar is preferably formed in that a non-conformal insulation collar layer is formed and at least a part of the non-conformal insulation collar layer is subsequently removed. The above described effect of pad nitride facetting at the edge of the trenches with the accompanying substrate erosion can be reliably prevented in this way. A significant simplification in the process of forming the insulation collar and the buried plate in the trench capacitor is obtained in particular in the case where at least a part of the non-conformal insulation collar layer is removed through the use of isotropic or anisotropic etching.

As an alternative, it is possible to form a conformal insulation collar layer with a superposed, non-conformal (sacrificial) protective layer, as a result of which cavities are reliably prevented from being etched free or incipiently etched in particular in the case of bottle-shaped trench capacitor structures.

A chemical deposition method (CVD), a plasma deposition method (PECVD, plasma enhanced CVD) or a chemical low-pressure deposition method (LPCVD) which is available anyway in standard processes is preferably used for forming the non-conformal insulation collar layer. Both the fabrication costs and the reliability of the trench capacitor can thereby be significantly improved.

Another mode of the invention includes the steps of forming a boundary layer on trench walls subsequent to the step of forming the trench, and removing the boundary layer in the lower region of the trench after the step of removing the sacrificial filling material.

A further mode of the invention includes the steps of forming the buried plate by using an outdiffusion from the boundary layer in the lower region of the trench.

Another mode of the invention includes the steps of forming the buried plate by using an outdiffusion from the boundary layer and concurrently densifying an insulation collar layer.

Yet another mode of the invention includes the steps of forming the buried plate by using an outdiffusion from the boundary layer and concurrently forming and densifying an insulation collar layer.

According to a further mode of the invention, the step of providing the sacrificial filling material includes filling the trench with the sacrificial filling material, and recessing (lowering) the sacrificial filling material as far as a given height.

With the objects of the invention in view there is also provided, a method for fabricating a trench capacitor, which includes the steps of:

forming a trench in a substrate;

forming a non-conformal layer in the trench;

removing at least a part of the non-conformal layer in a lower region of the trench;

forming a buried plate in the substrate adjacent to the lower region of the trench as a first capacitor plate;

forming a dielectric layer lining the lower region of the trench and lining an inner side of an insulation collar as a capacitor dielectric; and filling the trench with a conductive filling material as a second capacitor plate.

According to another mode of the invention, the step of forming the non-conformal layer includes forming a first conformal insulation collar layer having a first thickness outside the trench, and forming a second conformal insulation collar layer having a second thickness inside the trench.

According to yet another mode of the invention, the step of forming the non-conformal layer includes forming a conformal insulation collar layer having a given thickness outside the trench, and forming a non-conformal insulation collar layer having a varying thickness inside the trench.

According to a further mode of the invention, the step of forming the non-conformal layer includes forming a conformal insulation collar layer inside and outside the trench, and forming a non-conformal sacrificial protective layer having a varying thickness at least inside the trench.

According to another mode of the invention, the step of forming the non-conformal layer includes forming a plurality of layers.

Another mode of the invention includes the step of forming the non-conformal layer and/or the sacrificial protective layer by using a deposition process such as a CVD process, a PECVD process and a LPCVD process.

According to another mode of the invention, the step of removing at least a part of the non-conformal layer is performed by an etching process such as an isotropic etching process and an anisotropic etching process.

With the objects of the invention in view there is further provided, a method for fabricating a trench capacitor, which includes the steps of:

forming a trench in a substrate;

forming a conformal insulation collar layer in the trench;

forming a sacrificial filling material in a lower region of the trench;

forming a non-conformal sacrificial protective layer in an upper region of the trench;

removing at least a part of the non-conformal sacrificial protective layer for uncovering the sacrificial filling material;

removing the sacrificial filling material from the lower region of the trench;

removing the insulation collar layer in the lower region of the trench for forming an insulation collar;

forming a buried plate in the substrate adjacent to the lower region of the trench as a first capacitor plate;

forming a dielectric layer, which lines the lower region of the trench and an inner side of the insulation collar, as a capacitor dielectric; and filling the trench with a conductive filling material as a second capacitor plate.

According to another mode of the invention, the step of forming the sacrificial filling material includes filling the trench with the sacrificial filling material, and recessing or lowering the sacrificial filling material as far as a given height.

Another mode of the invention includes the step of forming the insulation collar layer and/or the sacrificial protective layer by using a deposition process such as a CVD process, a PECVD process or a LPCVD process.

According to another mode of the invention, the step of removing the insulation collar layer in the lower region of the trench is performed by using an isotropic etching process or an anisotropic etching process.

According to yet another mode of the invention, the step of removing at least a part of the sacrificial protective layer is performed by an isotropic etching process or an anisotropic etching process.

A further mode of the invention includes the step of forming the buried plate in a self-aligning manner with respect to the insulation collar layer.

Yet a further mode of the invention includes the step of forming the buried plate by using an outdiffusion from the sacrificial filling material.

A further mode of the invention includes the step of forming the buried plate by using a vapor phase doping.

Another mode of the invention includes the step of widening the lower region of the trench relative to an upper region of the trench for forming a bottle shape.

Other features which are considered as characteristic for the invention are set forth in the appended claims.

Although the invention is illustrated and described herein as embodied in a trench capacitor and an associated fabrication method, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 3:
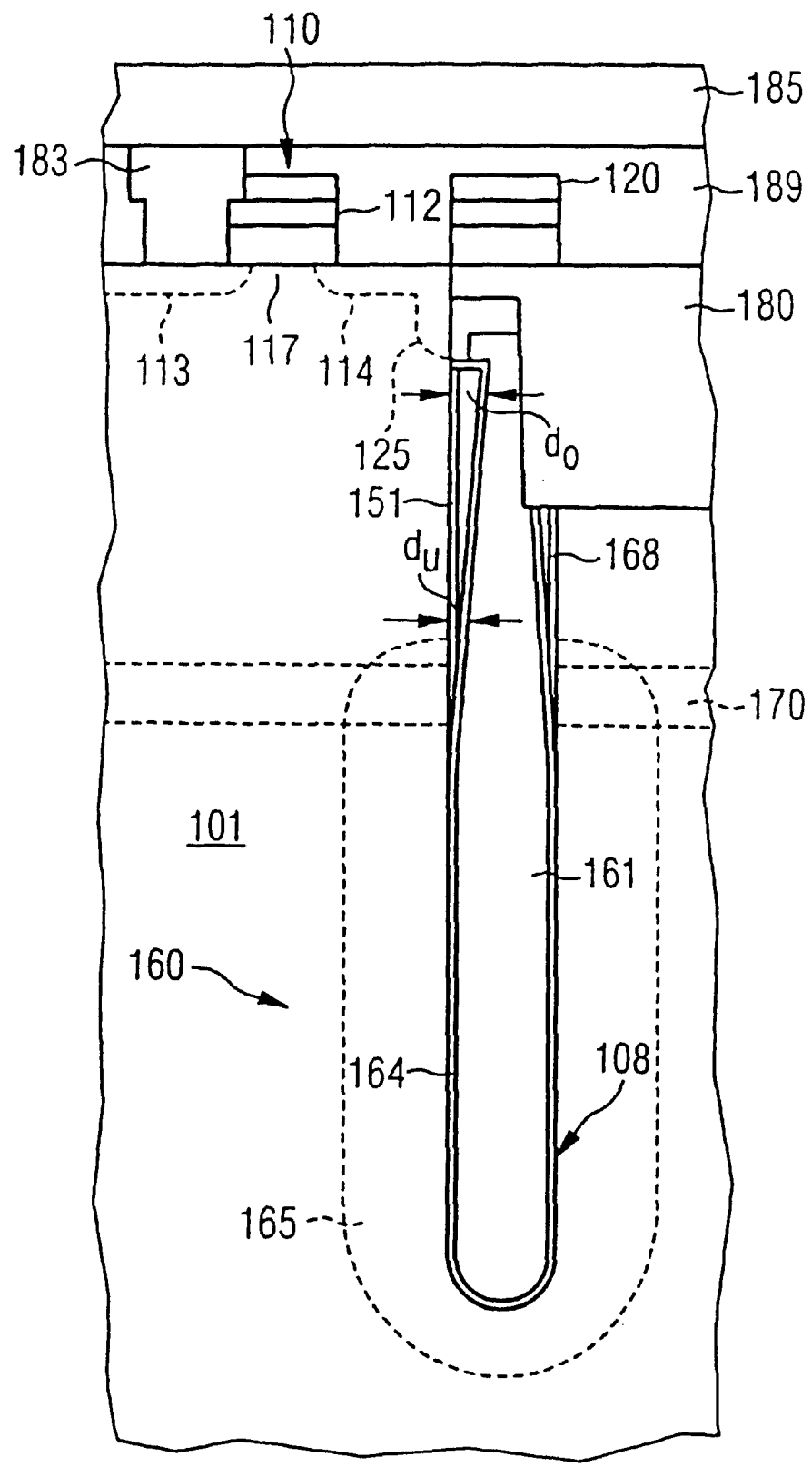
FIG. 3 is a simplified partial sectional view of a semiconductor memory cell with a trench capacitor in accordance with a first exemplary embodiment of the invention.

Referring now to the figures of the drawings in detail and first, particularly, to FIG. 3 thereof, there is shown a simplified sectional view of a semiconductor memory cell in accordance with a first exemplary embodiment of the invention. Identical reference symbols are used to designate identical or similar elements or layers in order to avoid repetitions in the detailed description of the invention.

Figure 1:
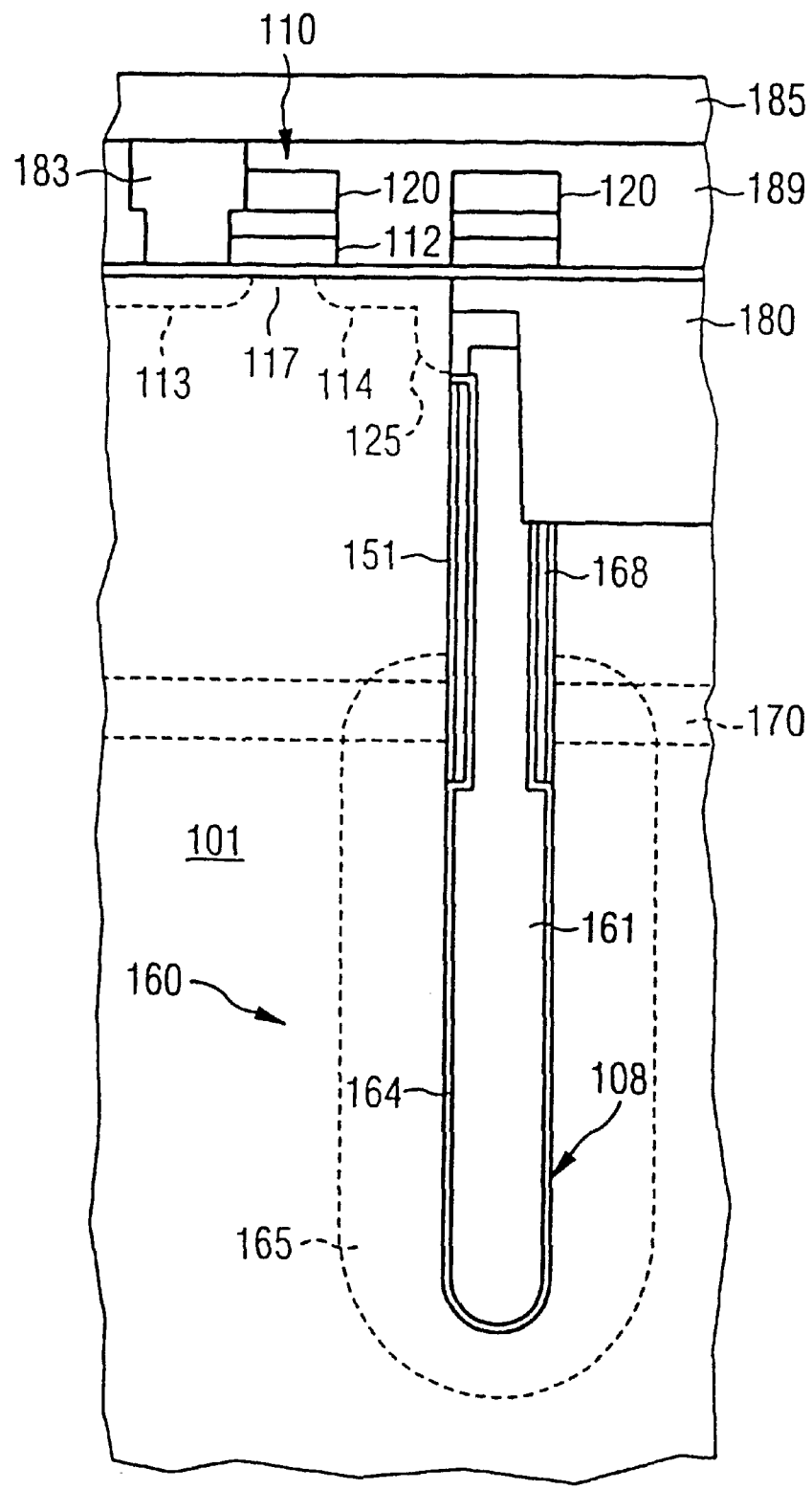
FIG. 1 is a simplified partial sectional view of a semiconductor memory cell with a trench capacitor in accordance with the prior art.

The essential difference between the semiconductor memory cell with trench capacitor in accordance with the first exemplary embodiment and the conventional semiconductor memory cell in accordance with FIG. 1 is that the insulation collar 168 is not formed conformally. More precisely, a layer thickness $d_o$ in an upper section of the insulation collar 168 is greater than a layer thickness $d_u$ in a lower section of the insulation collar 168. In this way, further improved leakage properties are obtained for the trench capacitor 160, since electrical insulation from the contact region 125 to the buried plate 165 is further improved.

In accordance with FIG. 3, the cross section of the insulation collar 168 is essentially triangular and tapers in the direction of the lower region of the trench 108. In this case, the non-conformal insulation collar 168 may include a single layer such as e.g. an oxide layer, a nitride layer or an oxynitride layer, but multilayer structures are also conceivable and favorable for the non-conformal insulation collar and the insulation collar 168 may include a plurality of, preferably, oxide, nitride and/or oxynitride layers. In addition to the improved leakage current behavior, however, a significant advantage of the non-conformal insulation collar consists in the simplification of a fabrication process for the trench capacitor 160, as is described in detail below.

Figure 2A:
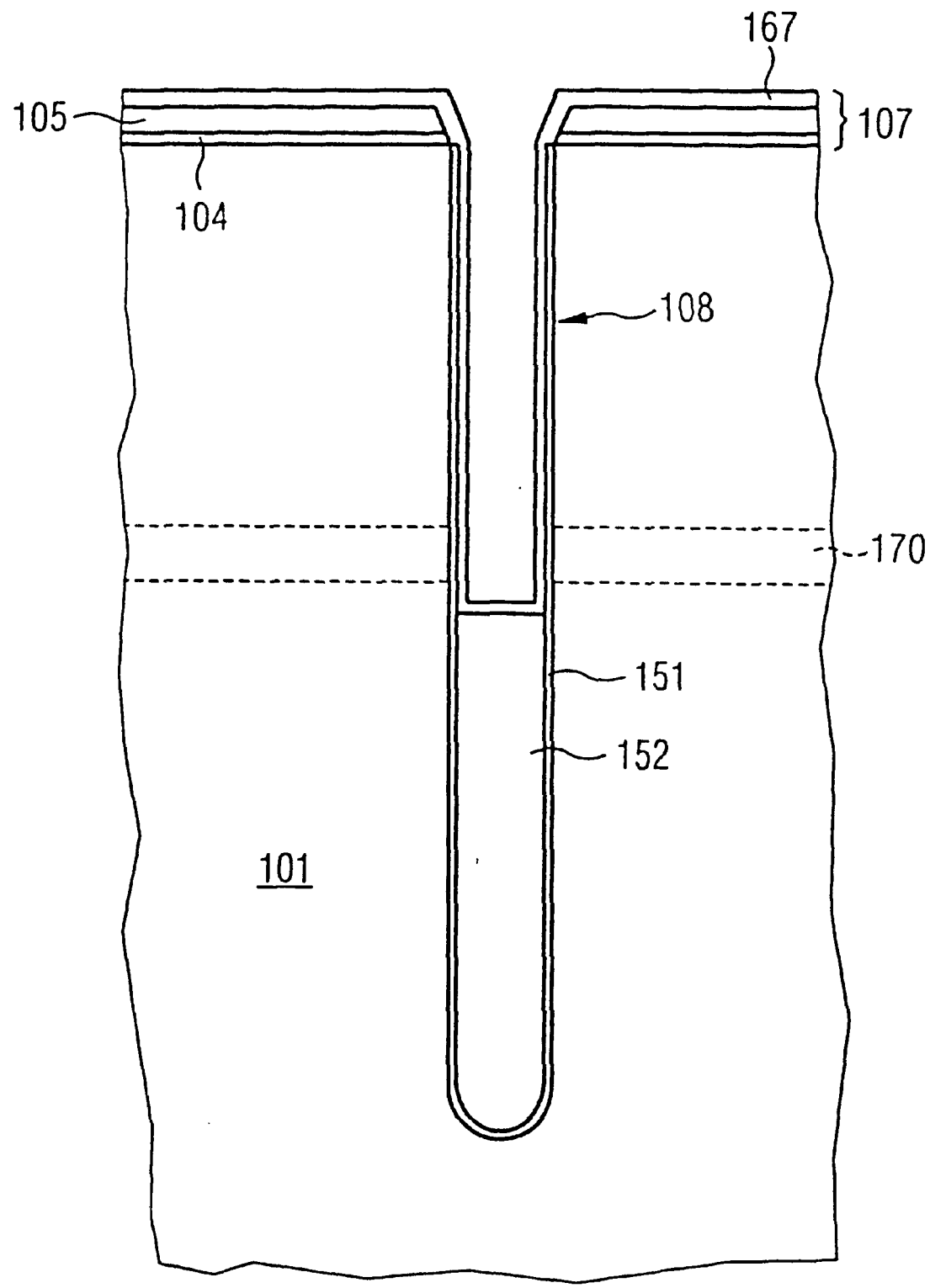
FIGS. 2A to 2C are diagrammatic partial sectional views of semiconductor structures illustrating method steps for forming an insulation collar in the trench capacitor in accordance with the prior art.
Figure 2B:
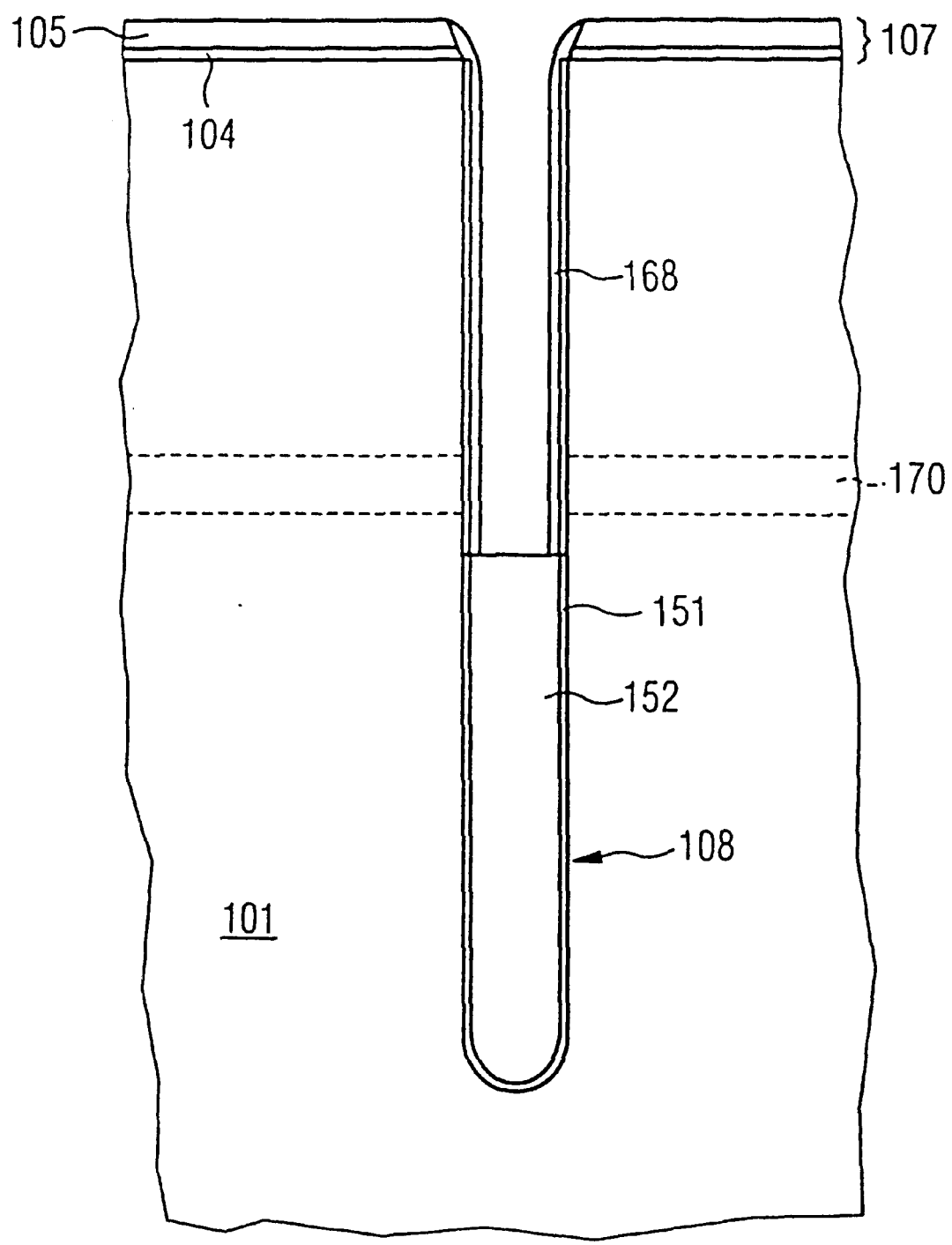
Figure 2C:
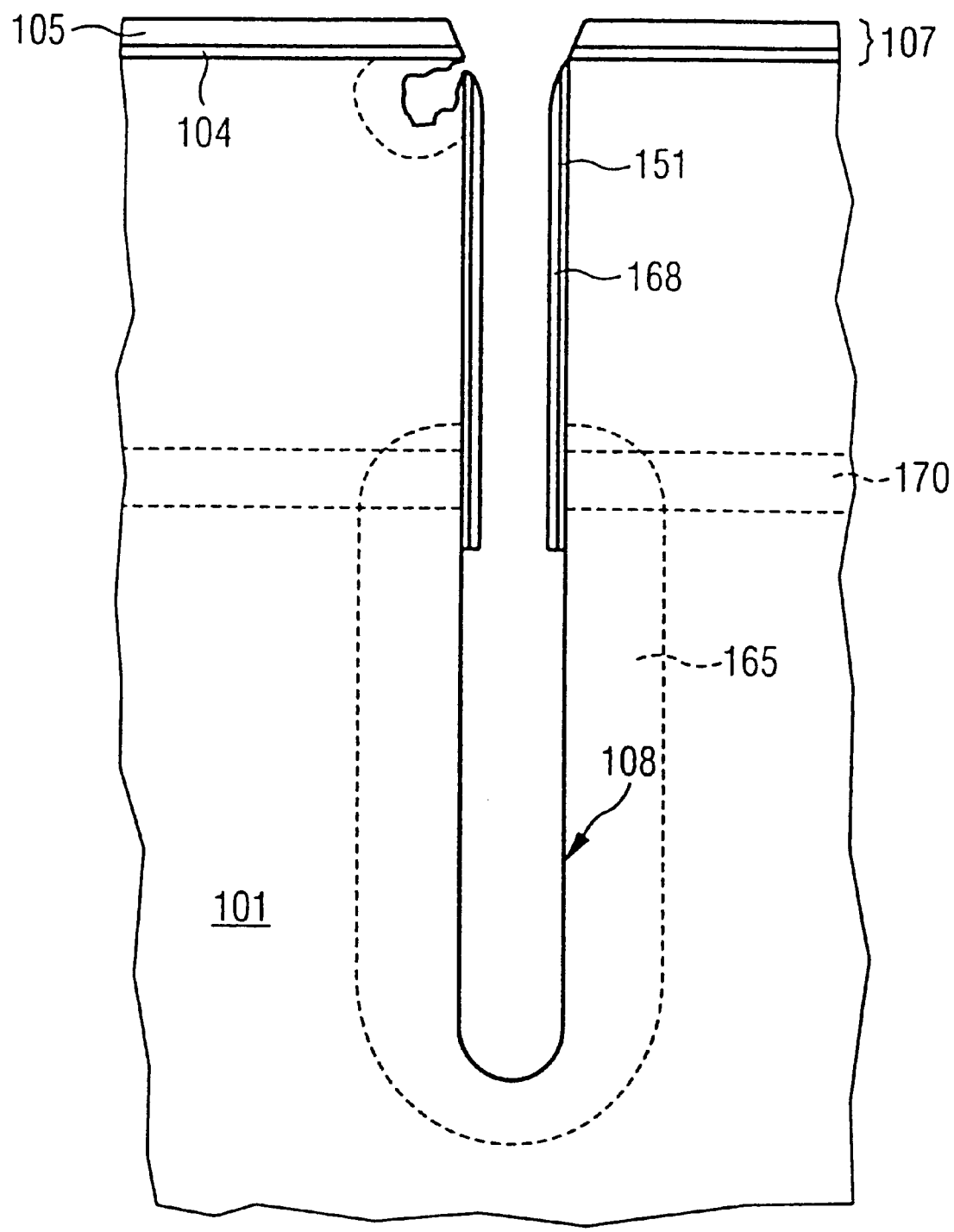
Figure 4:
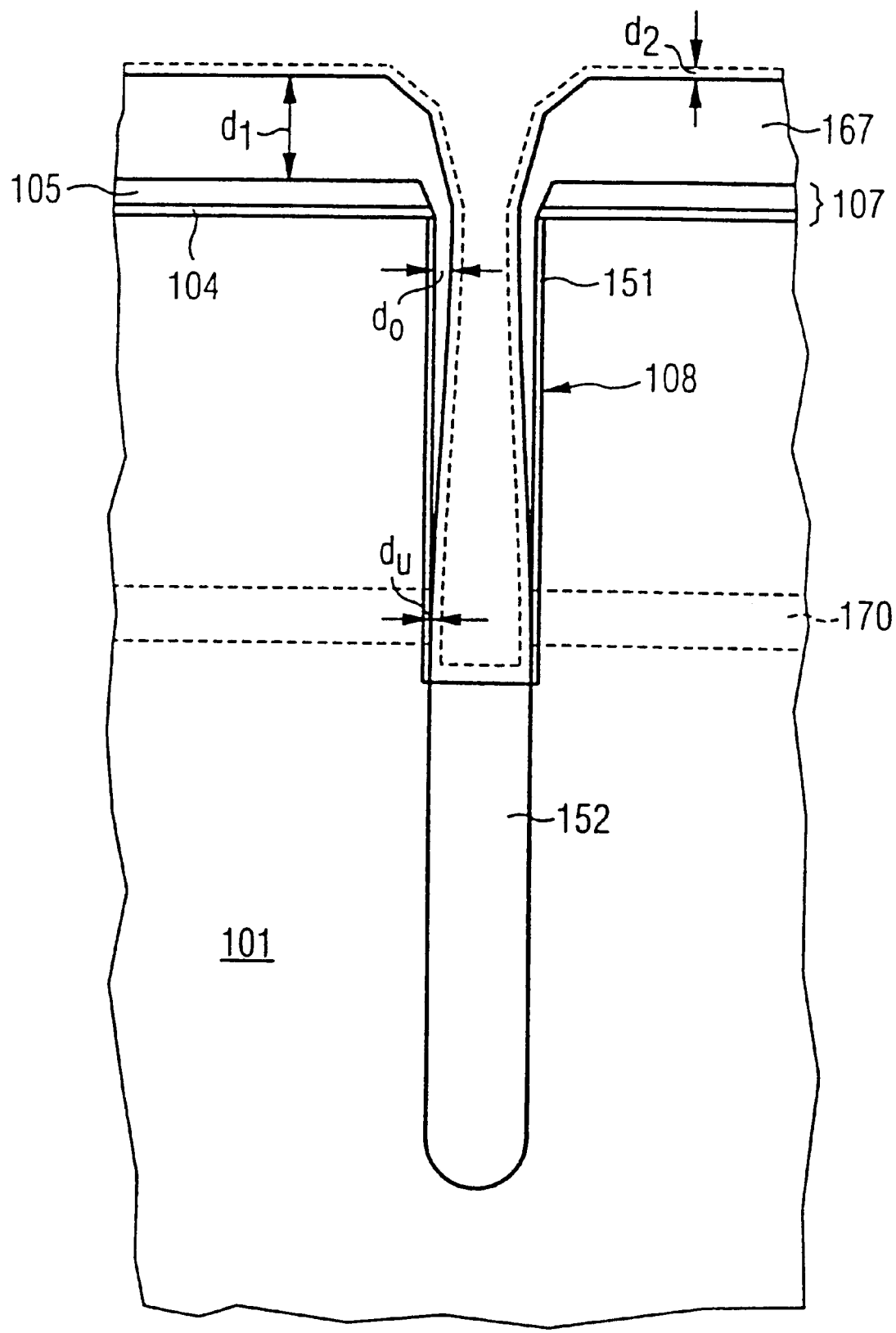
FIG. 4 is a simplified partial sectional view of the trench capacitor in accordance with the first exemplary embodiment for illustrating a first mode of fabricating the insulation collar.

FIG. 4 shows a simplified sectional view of the trench capacitor for illustrating a first embodiment for fabricating the insulation collar 168. In this case, FIG. 4 essentially corresponds to the conventional method steps in accordance with FIGS. 2A to 2C, which is why a detailed description of the elements and layers having identical reference symbols is dispensed with below.

In accordance with FIG. 4, in contrast to the conventional method, a non-conformal insulation collar layer 167 is deposited and is then eroded uniformly by isotropic etching. In this case, the broken line represents an original thickness or shape of the insulation collar layer 167 after a formation step, while the solid line represents the remaining part of the insulation collar layer after the removal or isotropic etching of a partial surface of the non-conformal insulation collar layer 167.

Accordingly, in accordance with FIG. 4, firstly a trench 108 is formed in the substrate 101 and, after the formation of the boundary layer 151, a sacrificial filling material 152 is introduced and sunk (recessed) as far as a lower region of the trench 108. The insulation collar layer 167 is then deposited non-conformally on the pad stack 107, which essentially includes a pad oxide layer 104 and a pad nitride layer 105.

In order to realize the non-conformal insulation collar layer deposition, by way of example, a chemical deposition method (CVD, chemical vapor deposition) with $SiH_4+O_2$ deposition is carried out at approximately 450° C. and a reduced pressure of a few 100 torr (13.33 kPa). As an alternative, however, it is also possible to carry out a chemical low-pressure deposition method (LPCVD, low pressure chemical vapor deposition), during which a TEOS (tetraethylene orthosilicate) deposition is carried out at approximately 600 to 800° C. and a pressure of 0.05 to 0.5 torr (6.67 Pa to 66.7 Pa), for example. A plasma deposition method (PECVD, plasma enhanced CVD) also enables a non-conformal deposition of layers and, in particular, of the insulation collar layer.

Consequently, in accordance with FIG. 4, a non-conformal insulation collar layer 167 is produced whose thickness $d_1$ outside the trench 108 is significantly larger than inside the trench and which is formed such that it is essentially triangular ($d_o > d_u$) inside the trench 108. The formation of the non-conformal insulation collar layer 167 may be followed, for example, by thermal oxidation and/or densification which is carried out, for example, at a temperature of 900° C. in an $O_2$ environment or a temperature of approximately 1000° C. in an $N_2$ environment for approximately one hour.

Afterward, the original insulation collar layer 167 (broken line) is etched back uniformly or conformally by a thickness $d_2 < 20$ nm through the use of isotropic etching, thereby producing the actual insulation collar layer 167 (solid line). Consequently, in accordance with FIG. 4, the sacrificial filling material 152 is reliably uncovered, while the upper edge region of the trench 108 remains covered with a sufficiently thick insulation collar layer 167. A thermally formed and/or deposited boundary layer 151 is initially situated both in the lower and in the upper region of the trench 108 and thus enables reliable removal of the sacrificial filling material 152 without incipient etching of the substrate 101. Afterwards, this boundary layer 151 is removed selectively in the lower region of the trench 108. In this way, uncontrolled hollowing-out of the substrate 101, as is illustrated for example in FIG. 2C, can be reliably prevented for subsequent etching steps. By way of example, these may be etching steps for widening the trench 108 selectively with respect to the insulation collar layer 167 (e.g. wet-chemical etching using $NH_4OH$ or KOH).

The subsequent formation of the buried plate 165 is preferably carried out by outdiffusion from the sacrificial filling material 152. As an alternative, however, it is also possible to carry out vapor phase doping, the insulation collar layer 167 acting as a diffusion barrier. In order to improve a barrier effect of this type, however, the insulation collar layer 167 may also include a plurality of layers, at least one of these layers acting as a preferred diffusion barrier. The boundary layer 151 formed below the sacrificial filling material 152 on the trench walls of the trench 108 as an etching stop layer is preferably formed by an LPCVD or CVD method with a thickness of 5 to 50 nm, but it may also have a native or thermally formed oxide layer ($SiO_2$). Removal of the sacrificial filling material 152 can thereby be significantly simplified.

In the same way, however, an etching stop layer of this type can be provided as a dopant source for forming the buried plate 165, an ASG layer preferably being used, (arsenosilicate glass). In this case, however, a barrier layer of this type is not formed in an upper region of the trench 108. In order to improve the electrical properties of the insulation collar 168, the latter is usually densified through the use of a thermal method. Such a densification operation is preferably carried out at the same time as the outdiffusion from the etching stop layer or during the formation of the insulation collar layer 167 and the outdiffusion from the etching stop layer. The wide variety of possibilities for forming the trench 108 and the buried plate 165 are not discussed further below, rather reference is made to the various methods as are employed in conventional methods. In this context, reference is made, in particular, to the methods disclosed in European Patent Application No. EP 0 949 680 A2.

Figure 5:
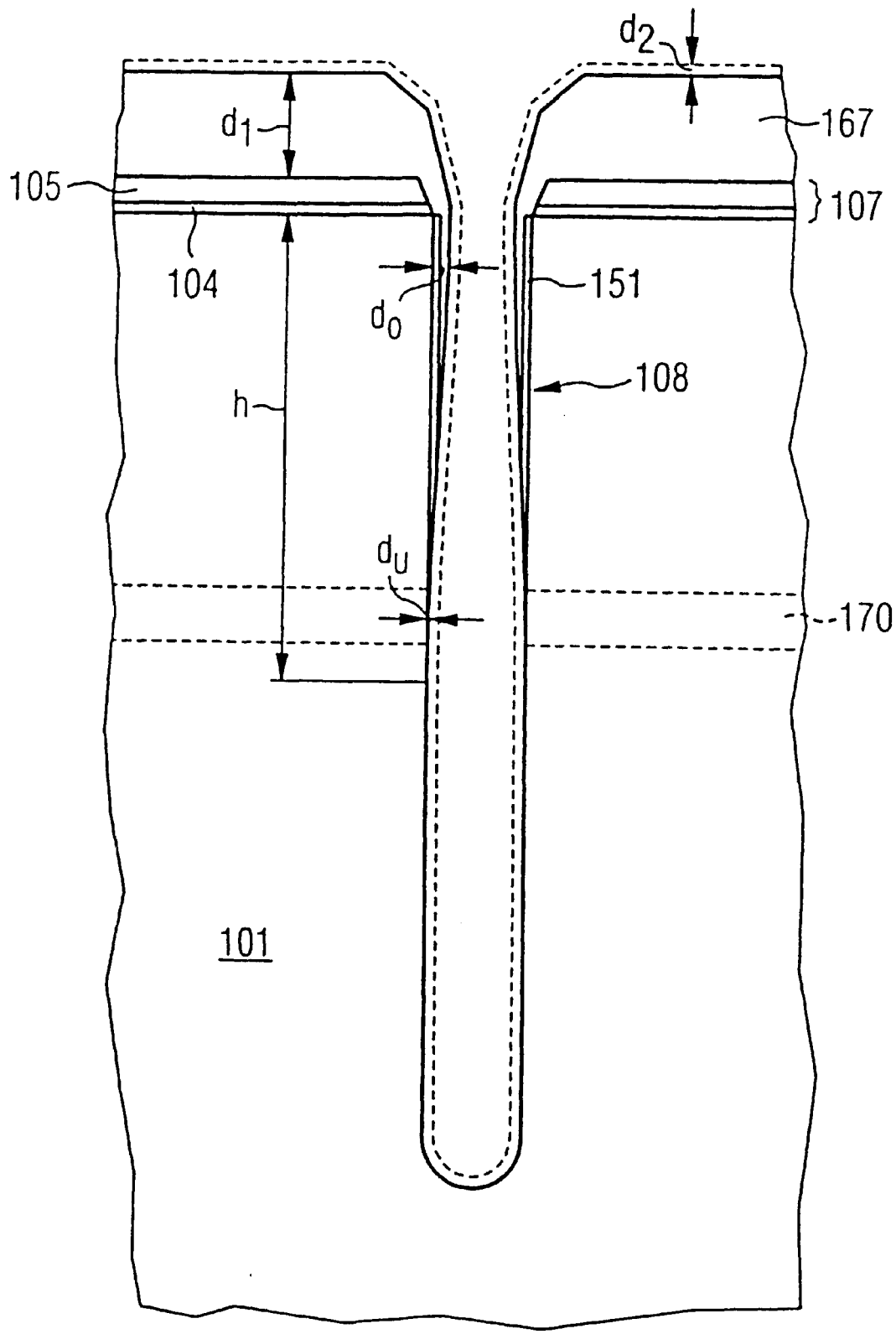
FIG. 5 is a simplified partial sectional view of the trench capacitor in accordance with the first exemplary embodiment for illustrating a second mode of fabricating an insulation collar.

FIG. 5 shows a simplified sectional view of a trench capacitor in accordance with the first exemplary embodiment for illustrating a second embodiment for fabricating the insulation collar 168.

In contrast to the embodiment in accordance with FIG. 4, a sacrificial filling material 152 is not used in FIG. 5, rather the non-conformal insulation collar layer 167 is formed completely in the trench 108. In this case, the non-conformal insulation collar layer 167 is formed in the same way as in the case of FIG. 4. After isotropic etching of the insulation collar layer 167, a non-conformal insulation collar 168 once again remains only in an upper region of the trench 108, the collar ensuring sufficient protection of the pad stack 107. In this case, a height h of the insulation collar 168 results essentially from the non-conformal deposition of the insulation collar layer 167 and the isotropic etching process for removing a topmost layer of the insulation collar layer 167.

The isotropic etching is preferably set in such a way that the eroded layer thickness $d_2$ of the insulation collar layer 167 is <20 nm and the remaining layer thickness $d_1$ of the insulation collar layer on the surface of the wafer is approximately 80 nm. In an upper section of the trench 108, the insulation collar layer 167 or the insulation collar preferably has a thickness $d_o$ of 40 nm.

The second embodiment in accordance with FIG. 5 is suitable, in particular, for vapor phase doping, the insulation collar 168 or the insulation collar layer 167 acting as a diffusion barrier. In this case the insulation collar layer 167 may once again include a plurality of layers, as a result of which a diffusion barrier effect and an etching stop effect can be improved further.

Figure 6:
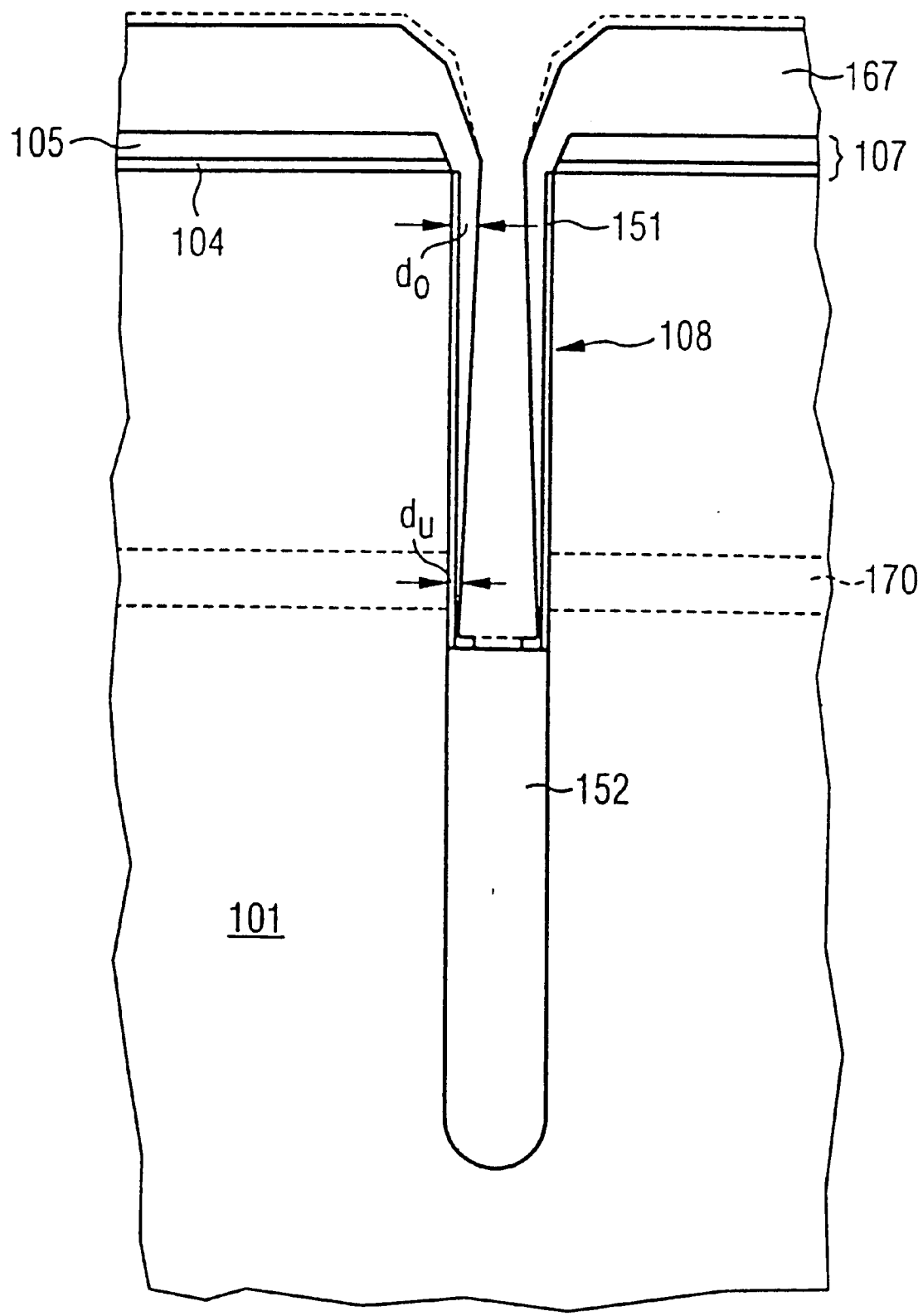
FIG. 6 is a simplified partial sectional view of the trench capacitor in accordance with the first exemplary embodiment for illustrating a third mode of fabricating an insulation collar.

FIG. 6 shows a simplified sectional view of a trench capacitor in accordance with the first exemplary embodiment for illustrating a third embodiment for fabricating the insulation collar. Identical reference symbols once again designate identical or similar elements or layers, which is why their detailed description is dispensed with below.

The embodiment in accordance with FIG. 6 essentially corresponds to the embodiment in accordance with FIG. 4, a sacrificial filling material 152 once again being used in the lower region of the trench 108. In accordance with FIG. 6, however, in place of the isotropic, i.e. undirected, etching, anisotropic, i.e. directed, etching is used, as a result of which only the dashed surface layer of the insulation collar layer 167 is removed. Whereas in the case of isotropic etching, uniform erosion of the insulation collar layer is carried out both outside and inside the trench 108, in the case of the anisotropic etching illustrated in FIG. 6, as can be carried out for example through the use of reactive ion etching (RIE), the insulation collar layer 167 is eroded only on its horizontal surfaces, i.e. on the surface outside the trench 108 and on the bottom region of the trench 108. Since the planar thickness of the insulation collar layer 167 is greater on the pad stack 107 than in the trench, the insulation collar layer inside the trench 108 is already open before the insulation collar layer on the pad stack 107 is completely eroded.

In this way, a sufficiently thick protective layer is once again obtained above the pad stack 107, as a result of which it is possible to reliably prevent erosion of the substrate on the trench upper edges and destruction of trenches in outer regions of the wafer. The yield is thus once again considerably increased, and, moreover, significantly smaller structure widths can be realized. The buried plate 165 is once again formed as in the first embodiment in accordance with FIG. 4.

Figure 7:
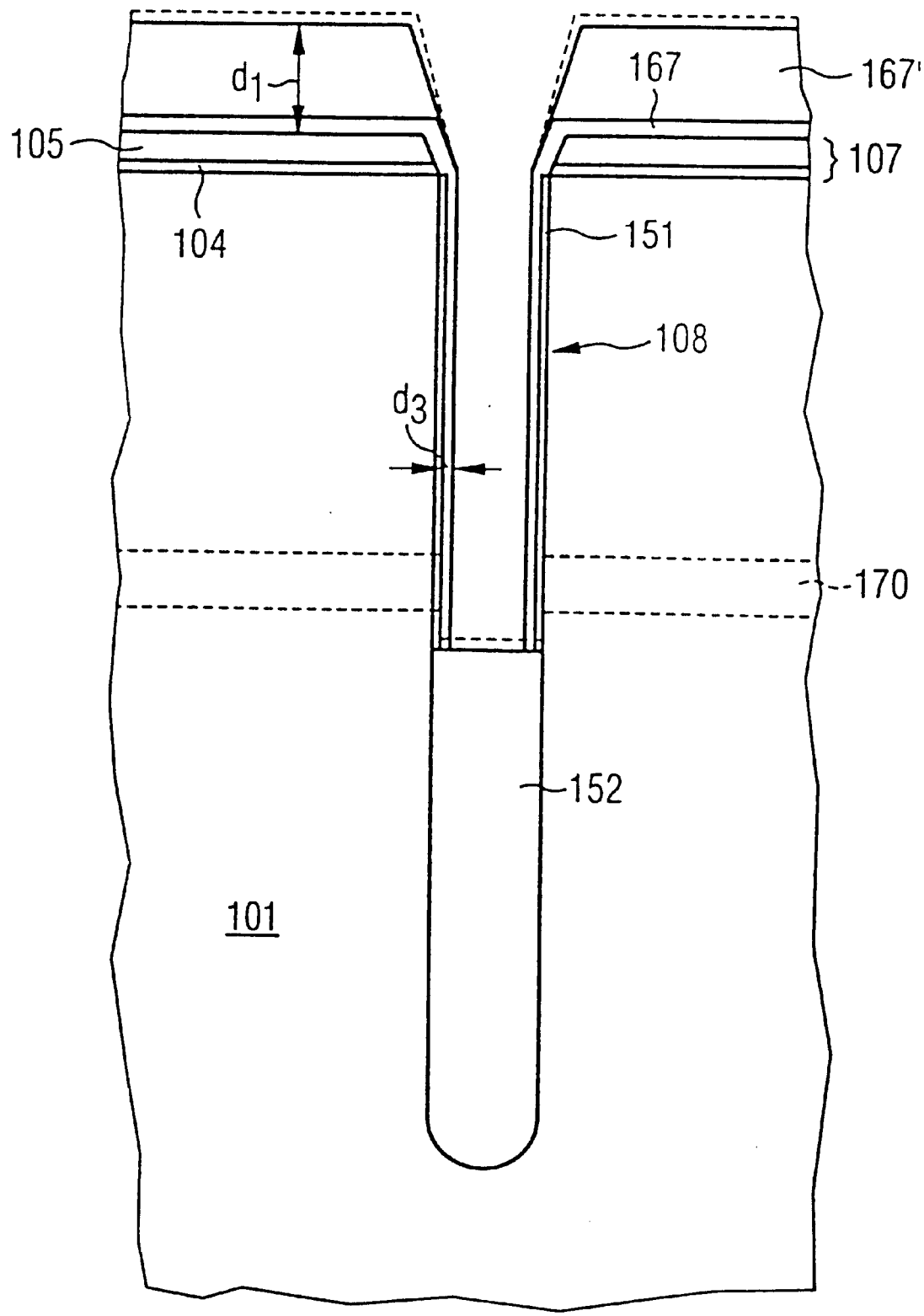
FIG. 7 is a simplified partial sectional view of a trench capacitor in accordance with a second exemplary embodiment of the invention for illustrating a further mode of fabricating an insulation collar.

FIG. 7 shows a simplified sectional view of a trench capacitor in accordance with a second exemplary embodiment of the present invention, identical reference symbols designating identical or similar elements or layers and a repeated description being dispensed with below.

In accordance with FIG. 7, the trench capacitor in accordance with the second exemplary embodiment has a conformal insulation collar, i.e. an insulation collar 168 having a constant layer thickness. Once again, however, a non-conformal insulation collar layer 167 and 167' is formed on the surface of the wafer. In this case, a thickness $d_1$ of the insulation collar layer 167 and 167' on the surface of the wafer or outside the trench 108 is significantly greater than a vertical layer thickness $d_3$ of the insulation collar layer 167 and 167' inside the trench 108 and a horizontal layer thickness which is subsequently to be opened.

Preferably, a non-conformal insulation collar layer 167 and 167' of this type is once again formed by the deposition method described in FIG. 4. In accordance with FIG. 7, however, the insulation collar layer may also include a double layer or multilayer structure, at least a first insulation collar layer 167 being formed conformally and a second insulation collar layer 167' being formed non-conformally preferably outside the trench 108.

In the exemplary embodiment in accordance with FIG. 7, only anisotropic etching is possible for removing at least a part of the insulation collar layer, since the insulation collar layer has an identical thickness $d_3$ in the side wall region and in the bottom region of the trench 108. The method illustrated in FIG. 7 is therefore preferably to be used in conjunction with a sacrificial filling material 152.

The formation of the buried plate 165 and the other modification possibilities once again correspond to the possibilities in the first exemplary embodiment.

Figure 8:
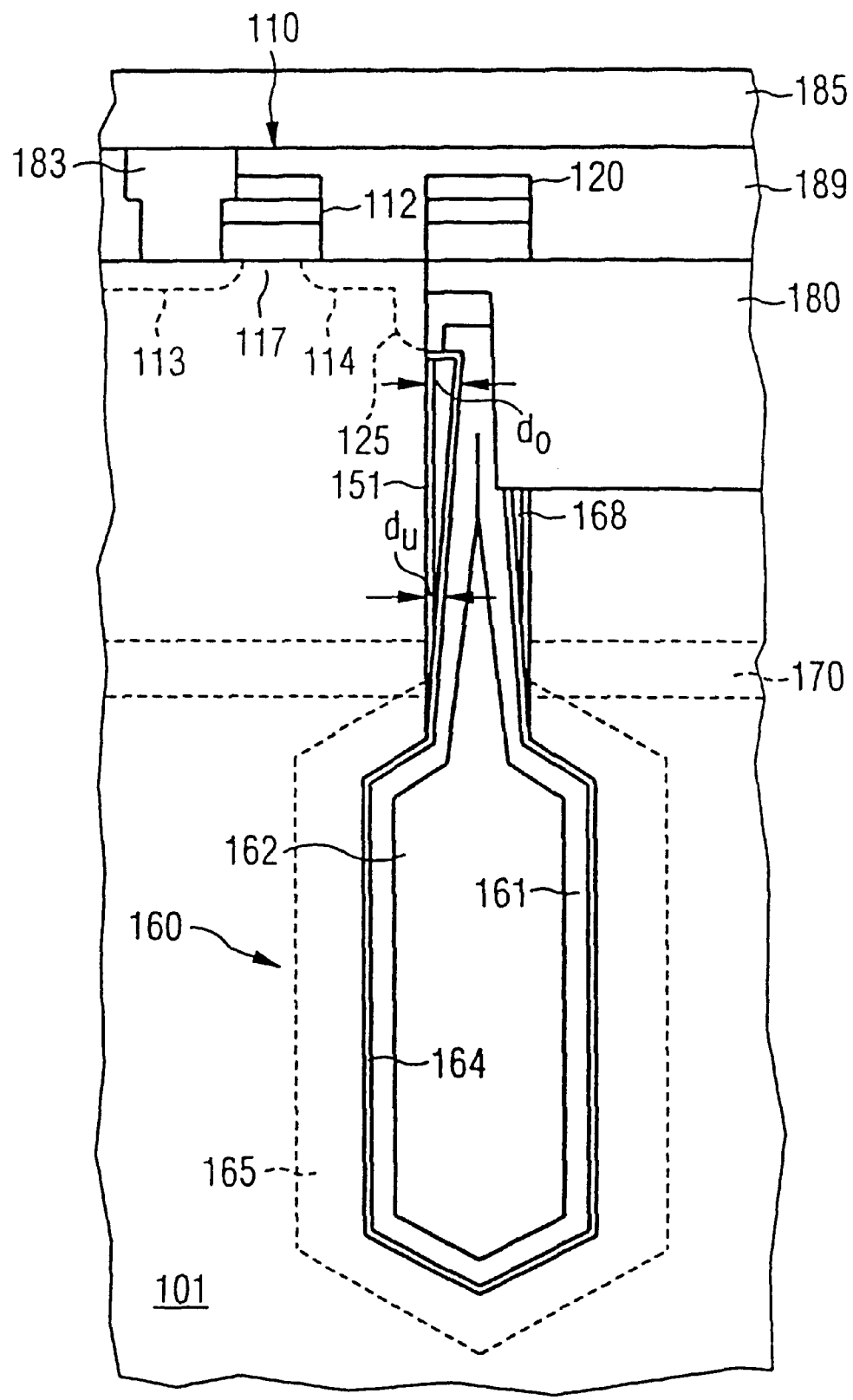
FIG. 8 is a simplified partial sectional view of a semiconductor memory cell with a trench capacitor in accordance with a third exemplary embodiment according to the invention.

FIG. 8 shows a simplified sectional view of a semiconductor memory cell with extended trench capacitor in accordance with a third exemplary embodiment, identical reference symbols designating layers or elements identical or similar to those in FIG. 1 and their description being dispensed with below in order to avoid repetition.

In contrast to the trench capacitor of the first and second exemplary embodiments described above, the essential difference of the trench capacitor 160 in accordance with the third exemplary embodiment is that the lower region of the trench 108 is widened or extended relative to the upper region in order to form a bottle shape. Such an extension is obtained through the use of isotropic etching, for example after the removal of the sacrificial filling material 152 and the boundary layer 151, the substrate 101 being eroded in the lower region of the trench 108 selectively with respect to the remaining insulation collar layer 167.

Such enlargement of the trench 108 serves, in particular, to increase the capacitance, as a result of which it is once again possible to realize smaller structure sizes or more extensive integration. As a result of the extension of the trench capacitor 160, a cavity 162 is produced in the lower region of the trench 108, the cavity essentially being surrounded by the conductive filling material 161. However, in this case, too, the non-conformal deposition of the insulation collar layer 167 once again results in improved protection for the pad stack 107, as a result of which it is possible to realize simplified fabrication of an insulation collar 168 in conjunction with an improved yield.

The formation of the insulation collar can once again be carried out at the same time as the densification of the collar. By way of example, an $NH_4OH$ wet etching method, a KOH wet etching method or an isotropic dry etching method can be used for extending the trench in the lower region.

In the exemplary embodiments described above, either isotropic wet etching, such as e.g. DHF (diluted hydrofluoric acid) or BHF (buffered hydrogen fluoride), or isotropic dry etching, such as e.g. $CF_4/O_2$, can be used for etching back the insulation collar layer 167 and/or removing the boundary layer 151. Reactive iron etching (RIE), e.g. $CF_4$ (also written CF4) or $C_4F_8$ (also written C4F8), is preferably used as an isotropic etching method for eroding the insulation collar layer.

In the exemplary embodiments described above, in order to form the buried plate 165, preferably vapor phase doping through the use of $AsH_3$ or $PH_3$ is carried out at a temperature of 900 to 1000° C. In the same way, however, it is also possible to effect doping from an ASG or PSG (phosphosilicate glass) layer in the trench 108.

The insulation collar layer 167 and 167' is preferably composed of silicon oxide, siliconitride or an oxynitride. However, it may also be composed of a different material and, in particular, have a multilayer structure, one layer acting as a protective layer relative to etching or diffusion.

Figure 9A:
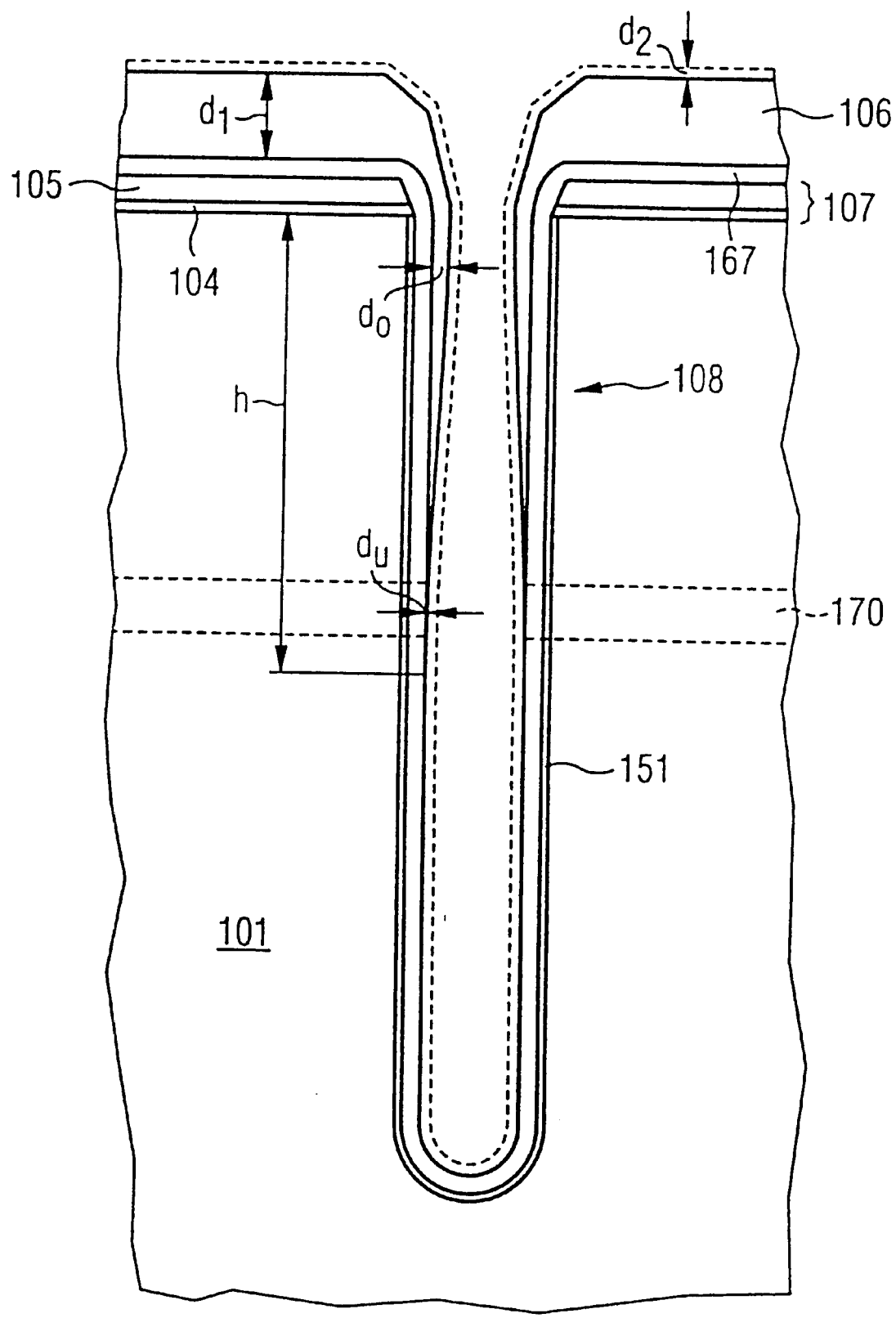
FIGS. 9A to 9C are simplified partial sectional views of a trench capacitor in accordance with a fourth exemplary embodiment of the invention for illustrating a first mode of fabricating an insulation collar.
Figure 9B:
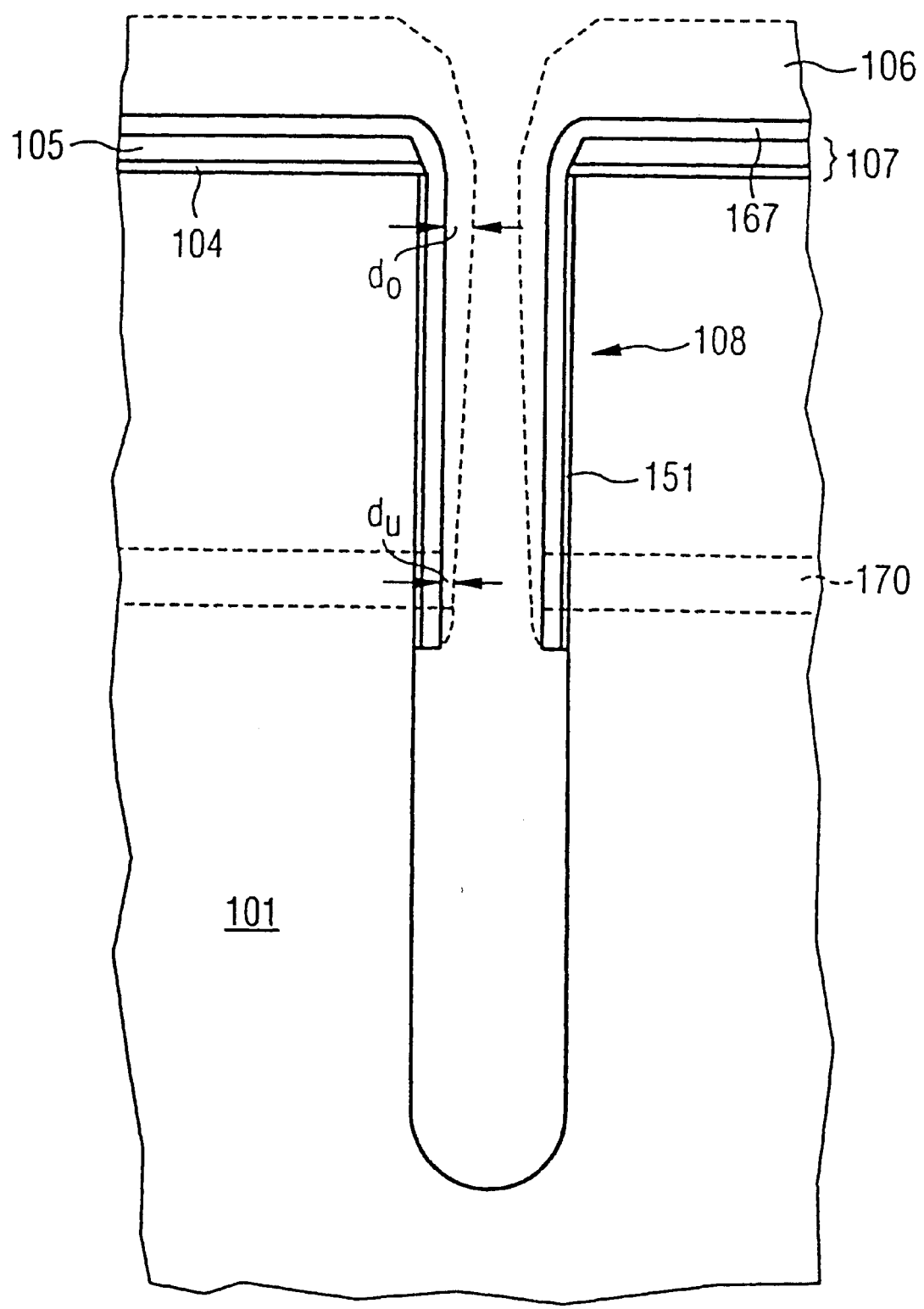
Figure 9C:
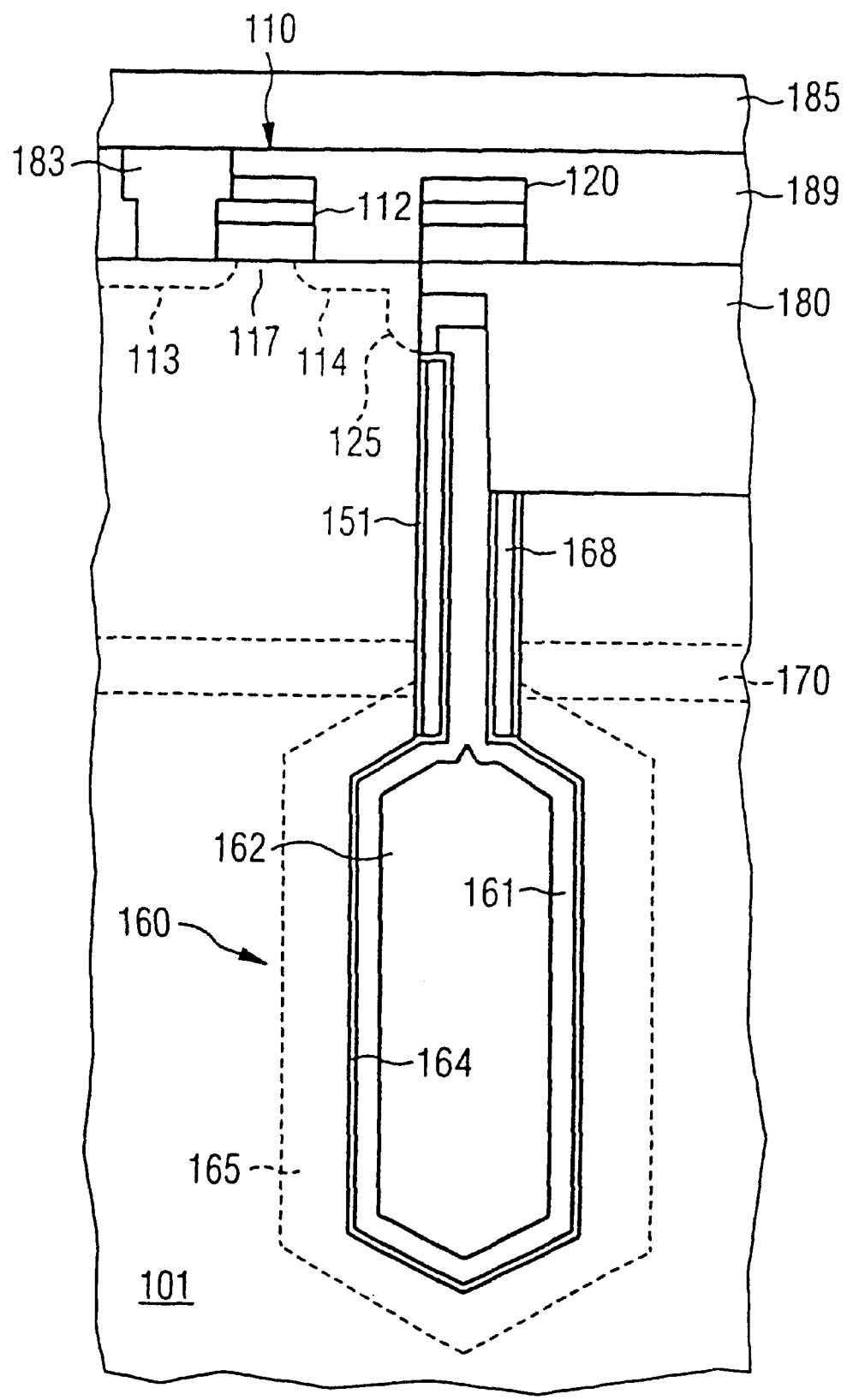

FIGS. 9A to 9C show simplified sectional views of a first embodiment of a trench capacitor in accordance with a fourth exemplary embodiment of the present invention, identical reference symbols designating identical or similar elements or layers and a repeated description being dispensed with below.

In accordance with FIG. 9A, firstly the trench 108 is formed in the substrate 101 and then a conformal insulation collar layer 167 is deposited and/or thermally formed on the side walls. The insulation collar layer 167 is preferably deposited in the trench as an $SiO_2$ layer having a thickness of approximately 5–50 nm through the use of a CVD or LPCVD method. In order to improve the leakage current properties of the insulation collar layer 167, "through-oxidation" for the purpose of forming a boundary layer 151 (thermal oxide) can be carried out through the use of thermal oxidation, for example.

Afterward, in a further method step, a non-conformal sacrificial protective layer 106 is formed in the trench 108 and on the surface of the wafer in such a way that the planar regions and also at least the upper region of the trench 108 are covered with a thicker layer. The sacrificial protective layer 106 is preferably deposited as an $Si_3N_4$ layer through the use of a PECVD or LPCVD method. However, it is also possible for Si or another material to be deposited non-conformally as the sacrificial protective layer 106. Accordingly, in accordance with FIG. 9A, the insulation collar layer has a constant thickness, while the sacrificial protective layer lying above it has the layer thicknesses $d_1 > d_o > d_u$ in the planar region of the wafer and also in the upper and lower regions of the trench 108.

In a subsequent method step, it is possible, for example, for the sacrificial protective layer 106 (broken line) to be etched back isotropically, as a result of which the insulation collar layer 167 is uncovered as far as a height h. However, the sacrificial protective layer 106 (solid line) can also be formed non-conformally in the trench in such a way that it does not cover the insulation collar layer 167 in the first place in the lower region of the trench 108 and, consequently, the isotropic etching-back can be omitted.

In accordance with FIG. 9B, in a subsequent method step, the lower region of the insulation collar layer is removed using the sacrificial protective layer 106 as a mask. Preferably, a wet-chemical (e.g. BHF) or a dry-chemical etching method is used for this removal of the insulation collar layer selectively with respect to the sacrificial protective layer 106. After the removal of the lower region of the insulation collar layer, the sacrificial protective layer 106 that still remains is completely removed in a subsequent method step, wet-chemical or isotropic dry-chemical methods (e.g. HF/EG or $H_3PO_4$ in the case of a nitride sacrificial protective layer) preferably being used.

In further method steps, the lower region of the trench 108 may subsequently (optionally) be widened selectively with respect to the insulation collar layer 167, as a result of which a bottle shape is once again obtained. A wet-chemical etching method using $NH_4OH$ or KOH is preferably used for widening the lower region of the trench.

Afterward, the buried plate 165 is once again formed selectively with respect to the insulation collar layer 167, vapor phase doping using $AsH_3$ at a temperature of 900° C. preferably being used. As an alternative, ASG or PSG deposition may be effected, drive-in of the dopants being effected during a subsequent heat treatment. The ASG or PSG layer is thereupon removed again and then a dielectric layer 164 is once again formed, in which case, in addition to nitride/oxide, dielectric materials having a high relative permittivity (e.g. $Al_2O_3$, $TiO_x$ . . . ) and also a combination with suitable metal electrodes (SIS, semiconductor-insulator-semiconductor; MIS, metal-insulator-semiconductor; MIM, metal-insulator-metal) are also possible. Finally, the trench 108 is filled with a conductive filling material 161 which serves as counterelectrode to the buried plate 165.

FIG. 9C shows a simplified sectional view of a semiconductor memory cell with extended trench capacitor as is formed by the method steps above. In contrast to the exemplary embodiment illustrated in FIG. 8, the particular advantage when using the method steps above is primarily that the method steps for forming the sacrificial filling material 152 (e.g. filling and sinking) and also the steps for removing (e.g. etching) the sacrificial filling material 152 and also parts of the insulation collar layer 167 are omitted. The production is thereby simplified further.

Figure 10:
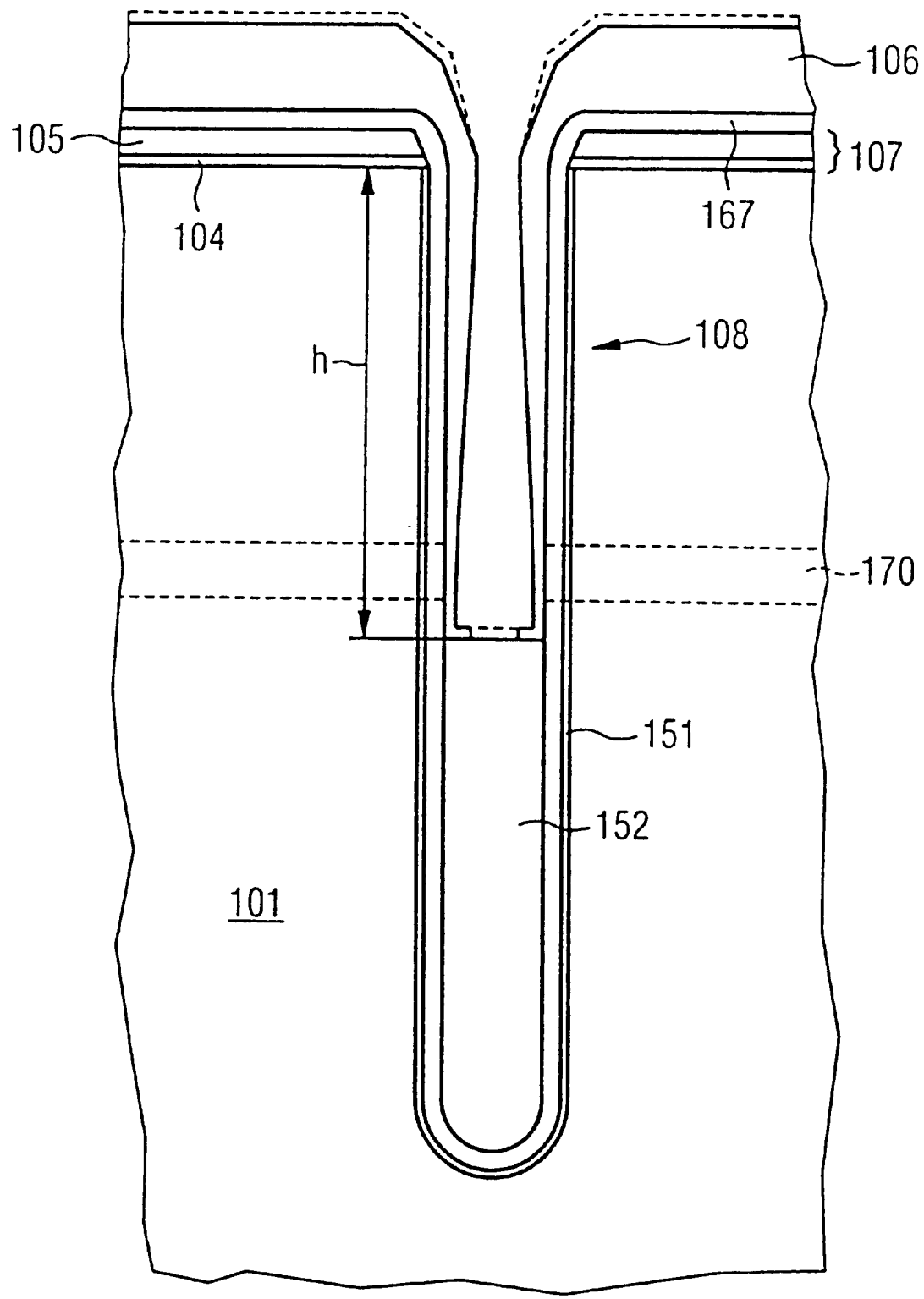
FIG. 10 is a simplified partial sectional view of a trench capacitor in accordance with the fourth exemplary embodiment for illustrating a second mode of fabricating an insulation collar.

FIG. 10 shows a simplified sectional view of a second embodiment of a trench capacitor in accordance with the fourth exemplary embodiment of the present invention, as is used in a preferred production method. Identical reference symbols designate elements or layers identical or similar to those in FIGS. 9A to 9C, which is why a repeated description is dispensed with.

In accordance with the second embodiment of the fourth exemplary embodiment of the present invention as illustrated in FIG. 10, it is also possible to use the below-described method steps for producing the semiconductor memory cell with trench capacitor illustrated in FIG. 9C. In this case, firstly the trench 108 is formed in the substrate 101. This is then followed once again by the conformal formation or deposition of the insulation collar layer 167 in the trench 108. In a subsequent step, however, a sacrificial filling material 152 is then formed in the trench 108 and sunk down to a depth h. In a subsequent method step, the sacrificial protective layer 106 is thereupon formed non-conformally in the trench 108 and, in a lower region, opened toward the sacrificial filling material through the use of an anisotropic etching method (broken line). By way of example, reactive ion etching (RIE) with $CF_4$ is used here.

The sacrificial layer filling material 152 can then be removed selectively with respect to the sacrificial protective layer 106 and with respect to the insulation collar layer 167. The insulation collar layer 167 is subsequently removed in the lower region of the trench 108 selectively with respect to the sacrificial protective layer 106 remaining in the upper region of the trench. By way of example, BHF wet etching is used here, the sacrificial protective layer having e.g. $Si_3N_4$.

Optionally, the trench 108 may then once again be widened below the remaining insulation collar layer 167. The buried plate 165 is subsequently formed for example through the use of vapor phase doping. The sacrificial protective layer 106 may subsequently be removed wet-chemically (e.g. using HF/EG or $H_3PO_4$) or dry-chemically. Afterward, the dielectric layer 164 and the conductive filling material 161 are once again formed in the trench, as a result of which a trench capacitor or a semiconductor memory cell in accordance with FIG. 9C is once again obtained. Since only the sacrificial protective layer is formed non-conformally, an improved filling behavior for the dielectric layer 164 and, in particular, for the conductive filling material 161 is obtained in this way on account of the conformal insulation collar 168, as a result of which the properties of the trench capacitor are improved further.

The invention has been described above using a DRAM semiconductor memory cell. However, it is not restricted thereto, but rather includes all further integrated circuits in which a trench capacitor can be used, such as e.g. memory devices with random memory access (RAM), synchronous dynamic random access memories (SDRAM), static random access memories (SRAM), read-only memories (ROM) and also programmable logic arrays (PLA), application-specific circuits (ASIC) and embedded logic memory circuits.

I claim:

1. A trench capacitor, comprising:
   a substrate having a trench formed therein, said trench having an upper region and a lower region;
   a non-conformed insulation collar in said upper region of said trench, said insulation collar having a top and a bottom, said insulation collar having a thickness tapering from said top toward said bottom;
   a buried plate formed adjacent to said lower region of said trench as a first capacitor plate;
   a dielectric layer lining said lower region of said trench and said insulation collar as a capacitor dielectric; and
   a conductive filling material filled into said trench as a second capacitor plate.

2. The trench capacitor according to claim 1, wherein said insulation collar has a substantially triangular cross-section.

3. The trench capacitor according to claim 1, wherein said insulation collar includes a plurality of layers.

4. The trench capacitor according to claim 3, wherein at least one of said plurality of layers is a non-conformed layer.

5. The trench capacitor according to claim 1, wherein:
   said trench is a bottle-shaped trench; and
   said conductive filling material has a widened region with a cavity formed therein.

6. The trench capacitor according to claim 1, wherein said insulation collar is composed of at least one material selected from the group consisting of an oxide, a nitride and an oxinitride.

* * * * *